(12) United States Patent
Takahashi

(10) Patent No.: US 7,023,747 B2
(45) Date of Patent: Apr. 4, 2006

(54) SEMICONDUCTOR MEMORY DEVICE AND ADDRESS CONVERSION CIRCUIT

(75) Inventor: Hiroyuki Takahashi, Kanagawa (JP)

(73) Assignee: NEC Electronics Corp., Kanagawa (JP)

( * ) Notice: Subject to any disclaimer, the term of this patent is extended or adjusted under 35 U.S.C. 154(b) by 326 days.

(21) Appl. No.: 10/433,130

(22) PCT Filed: Nov. 27, 2001

(86) PCT No.: PCT/JP01/10335

§ 371 (c)(1),
(2), (4) Date: May 29, 2003

(87) PCT Pub. No.: WO02/45093

PCT Pub. Date: Jun. 6, 2002

(65) Prior Publication Data

US 2004/0125684 A1    Jul. 1, 2004

(30) Foreign Application Priority Data

Nov. 29, 2000 (JP) .............................. 2000-362849

(51) Int. Cl.
*G11C 7/00* (2006.01)
(52) U.S. Cl. .................. 365/200; 365/222; 365/230.03
(58) Field of Classification Search ................ 365/200, 365/230.03, 222
See application file for complete search history.

(56) References Cited

U.S. PATENT DOCUMENTS 5,598,373 A    1/1997   Wada et al.
6,341,090 B1 *  1/2002  Hiraki et al. ................ 365/200
6,347,063 B1 *  2/2002  Dosaka et al. ............... 365/233
6,453,400 B1 *  9/2002  Maesako et al. ............. 711/167

FOREIGN PATENT DOCUMENTS

| JP | 64-59700    | 3/1989  |
| JP | 1-166147    | 6/1989  |
| JP | 6-139371    | 5/1994  |
| JP | 8-16486     | 1/1996  |
| JP | 10-124200   | 5/1998  |
| JP | 10-289595   | 10/1998 |
| JP | 2000-260197 | 9/2000  |

\* cited by examiner

*Primary Examiner*—Michael Tran
(74) *Attorney, Agent, or Firm*—Muirhead & Saturnell LLP

(57) ABSTRACT

It is an object of the present invention to provide a semiconductor memory device with a suitable redundancy circuit and an address conversion circuit, wherein external addresses are allocated to both a memory cell array which needs refresh, typically DRAM and another memory cell array which does not need refresh, typically SRAM. The semiconductor memory device comprises a dynamic memory cell array 11 further comprising an array of a plurality of dynamic memory cells, a static memory cell array 12 further comprising an array of a plurality of static memory cells, a pre-decoder 101 for converting an external address Add into a row pre-decode signal A1 or A2 which corresponds to any memory cell in the dynamic memory cell array 11 or the static memory cell array 12, a redundancy program circuit 103 for specifying a memory cell being to be replaced in the dynamic memory cell array 11, and a second conversion means (redundancy judging circuit) for converting an external address Add, which corresponds to the memory cell specified by the redundancy program circuit 103, into a row pre-decode signal A4, which corresponds to a predetermined memory cell in the static memory cell array 12.

16 Claims, 3 Drawing Sheets

SEMICONDUCTOR MEMORY DEVICE AND ADDRESS CONVERSION CIRCUIT

TECHNICAL FIELD

The present invention relates to a semiconductor memory device and an address conversion circuit, and more particularly to a semiconductor memory device which has a memory cell array needing refresh typically DRAM (a dynamic random access memory) and another memory cell array needing no refresh typically SRAM (a static random access memory), as well as a redundancy circuit provided for remedying a specific defecrtive part of a memory cell.

BACKGROUND OF ART

In conventional electronic devices such as portable terminals, there may be two kinds of operation mode, for example, a normal operation mode causing a relatively large power consumption and a stand-by mode saving a power consumption. For example, a portable telephone device performs communications and data input-output operations in the normal operation mode and queues for receiving in the stand-by mode. Such portable telephone device is provided with a non-volatile memory such as a flash memory and a volatile memory such as an SRAM and a DRAM, which are used for different purposes, taking into account different features of performances (or specification) of those memories. The non-volatile memory is used mainly for holding data for a long term. The SRAM exhibits a high speed access and has a low power consumption, for which reason the SRAM is used for storing data which receive frequent accesses in the stand-by mode in addition to the normal mode. The DRAM needs refresh operations and causes a relatively large power consumption but has a large capacity, for which reason the DRAM is used mainly for providing a data storing area in the normal mode. For example, data such as telephone numbers are stored in the non-volatile memory, because those data are needed to be held even when a battery power is lost. Data stored in the SRAM are data which receive frequent accesses and are prevented from disappearing in a stand-by state, such as data used for communication to a base station in the stand-by state. A relatively large amount of data such as display data are stored in the DRAM because those data are allowed to be disappeared in the stand-by state.

Japanese laid-open patent publication No. 10-124200 "portable information terminal" describes one example of the conventional configurations, wherein a normal operation mode and a stand-by mode (or suspend mode) are provided for a portable information terminal including SRAM and DRAM as described above. In accordance with the configuration described in this publication, a high speed execution of a system software appears in the normal operation mode, while in the stand-by mode, the data area is switched from the DRAM to the SRAM, for subsequent low speed execution of a power control program which has been stored in a ROM (read only memory) and the SRAM. Examples of the control methods for having accesses to both the SRAM and the DRAM with the same configuration are described in Japanese laid-open patent publication No. 6-139371 "microcomputer", and Japanese laid-open patent publication No. 1-166147 "memory control circuit". In accordance with the prior art described in Japanese laid-open patent publication No. 6-139371, a signal processor has accesses to both the SRAM and the DRAM, wherein a memory, to which an access is intend to be made, is discriminated. If an access-object is the SRAM, then all bits of the address are outputted one time. If the access-object is the DRAM, then row and column addresses are outputted with time-division. In accordance with the configuration described in Japanese laid-open patent publication No. 1-166147, there are further provided a refresh counter which generates a refresh address for the RAM and an address switching circuit, so that a multiple address and a non-multiple address are switched depending on the access-object, and further a refresh operation to the DRAM is automatically executed.

There are other conventional semiconductor memory devices with both the SRAM and the DRAM, wherein the SRAM with a small capacity is combined to the DRAM with a relatively large capacity, so that the SRAM is used as a cache memory of the DRAM. In accordance with this configuration, data read operations from the DRAM and data write operations into the DRAM are taken place through the SRAM which allows relatively high speed accesses, resulting in high speed accesses being realized. In this configuration, however, only an address space of the DRAM is recognized from outside of the semiconductor memory device. Independent accuses to both the SRAM and the DRAM are not possible as described in the above publications.

Meanwhile, the other conventional semiconductor memory device utilizes a technique for saving a device function by replacing a defective bit line or a defective word line with any defectiveness caused in the manufacturing processes, into a bit line or a word line in a redundancy memory cell array provided in the same semiconductor memory device. The redundancy memory cell array may be provided in the same memory chip as the memory cell array which should be saved, or in a redundancy chip which is provided over a mounting board and is separated from the memory cell array which should be saved, wherein the mounting board has a plurality of memory chips or a packaged chip. Japanese laid-open patent publication No. 8-16486 "defect-saving LSI and memory device" describes one example of the conventional saving configuration for replacing the defect caused in the DRAM chip in a module into a redundancy SRAM chip in the module.

DISCLOSURE OF INVENTION

It is an object of the present invention to provide a semiconductor memory device with a suitable redundancy circuit and an address conversion circuit, wherein external addresses are allocated to both a memory cell array which needs refresh, typically DRAM and another memory cell array which does not need refresh, typically SRAM.

The present invention provides a semiconductor memory device comprising: a dynamic memory cell array further comprising an array of a plurality of dynamic memory cells; a static memory cell array further comprising an array of a plurality of static memory cells; a first conversion means (pre-decoder) for converting an external address into an address which corresponds to any memory cell in the dynamic memory cell array or the static memory cell array; a memory cell specifying means for specifying at least a memory cell in the dynamic memory cell array, the at least memory cell being to be replaced; and a second conversion means (redundancy judging circuit) for converting an external address, which corresponds to the at least memory cell specified by the memory cell specifying means, into an address, which corresponds to a predetermined memory cell in the static memory cell array.

The semiconductor memory device may further comprise: a refresh control means for controlling refresh operations to the dynamic memory cell array; and a control means for at least discontinuing operations the refresh control means based on an external control signal.

The refresh control means may further include: a refresh address generating circuit for repeatedly generating a refresh address which corresponds to each memory cell of the dynamic memory cell array, based on a predetermined timing signal; and a selecting circuit for selecting any one of the external address and the refresh address.

A supply of a power to the dynamic memory cell array may be discontinued by the external control signal.

The memory cell specifying means may be adopted to specify a memory cell which is to be replaced in the dynamic memory cell array and also specifies another memory cell which is to be replaced in the static memory cell array.

The second conversion means may be adopted for converting an external address, which corresponds to the at least memory cell specified by the memory cell specifying means, into an address, which corresponds to a predetermined memory cell in the static memory cell array. When the second conversion means converts the external address, which corresponds to the memory cell specified by the memory cell specifying means, into the address, which corresponds to the predetermined memory cell in the static memory cell array, the second conversion means converts the external address into the address within the address range specified by the memory cell specifying means, and also the second conversion means converts an external address, which corresponds to a memory cell other than the memory cells specified by the memory cell specifying means, into an address outside an address range set by an address range setting means.

The present invention further provides a semiconductor memory device comprising: a first memory cell array having a plurality of memory cells which need refresh; a second memory cell array having a plurality of memory cells which do not need refresh; and a first conversion circuit for comparing a replaced address, which designates a memory cell to be replaced in the first and second memory cell arrays, with an external input address, wherein if the replaced address does not correspond to the external address, then the first conversion circuit allows an access to a memory cell designated by the external address, and wherein if the replaced address corresponds to the external address, then the first conversion circuit converts the external address into a replace-destination address, with which the replaced address is to be replaced, the replace-destination address designates a memory cell in a predetermined area in the second memory cell array, and the first conversion circuit allows an access to the replace-destination address.

A replaced address memory circuit may further be provided for storing the replaced address. The replaced address memory circuit may comprise a program circuit.

If the replaced address does not correspond to the external address, then the first address conversion circuit may generate a signal which invalidates a first address signal designating a memory cell in the first memory cell array, a second address signal designating a memory cell in the second memory cell array, and a selecting signal selecting any one of the first and second memory cell arrays.

A replace-destination address range setting circuit may further be provided for setting a replace-destination address range in the second memory cell array, so that if the replaced address does not correspond to the external address, then the first address conversion circuit converts the external address into an address outside the replace-destination address range as set, and if the replaced address corresponds to the external address, then the first address conversion circuit converts the external address into an address in the replace-destination address range as set.

The first memory cell array may have a dedicated decode circuit for decoding an address in the predetermined area, and the first address conversion circuit may supply the replace-destination address directly to the decode circuit.

The present invention further provides an address conversion circuit for converting an address which designates a memory cell in a semiconductor memory device which has a first memory cell array having a plurality of memory cells which need refresh, and a second memory cell array having a plurality of memory cells which do not need refresh, wherein the address conversion circuit compares a replaced address, which designates a memory cell to be replaced in the first and second memory cell arrays, with an external input address, wherein if the replaced address does not correspond to the external address, then the address conversion circuit allows an access to a memory cell designated by the external address, and wherein if the replaced address corresponds to the external address, then the address conversion circuit converts the external address into a replace-destination address, with which the replaced address is to be replaced, the replace-destination address designates a memory cell in a predetermined area in the second memory cell array, and the first conversion circuit allows an access to the replace-destination address.

A replaced address memory circuit may further be provided for storing the replaced address. The replaced address memory circuit may comprise a program circuit.

If the replaced address does not correspond to the external address, then the address conversion circuit may generate a signal which invalidates a first address signal designating a memory cell in the first memory cell array, a second address signal designating a memory cell in the second memory cell array, and a selecting signal selecting any one of the first and second memory cell arrays.

The first memory cell array may have a dedicated decode circuit for decoding an address in the predetermined area, and the address conversion circuit supplies the replace-destination address directly to the decode circuit.

BEST MODE FOR CARRYING OUT THE INVENTION

First Embodiment

Figure 1:
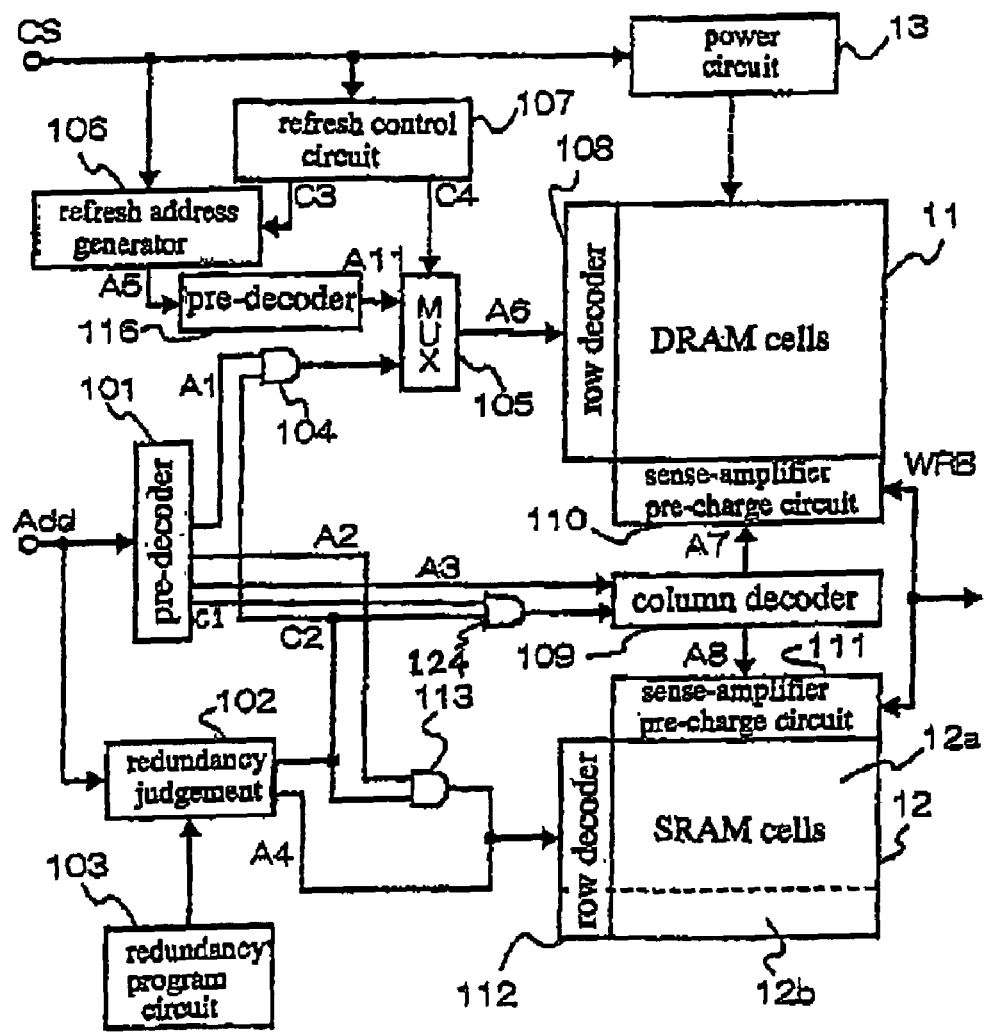
FIG. 1 is a block diagram illustrative of a configuration of a semiconductor memory device of a first embodiment in accordance with the present invention.

A first embodiment of the semiconductor memory device in accordance with the present invention will hereinafter be described with reference to the drawing. FIG. 1 is a block diagram illustrative of a configuration of a semiconductor memory device of a first embodiment in accordance with the present invention. The semiconductor memory device shown in FIG. 1 comprises a DRAM cell array 11, which further comprises a plurality of DRAM memory cells, an SRAM cell array 12, which further comprises a plurality of SRAM memory cells, and peripheral circuits thereof, which are provided on a single chip. The block diagram of FIG. 1 is to illustrate a primary configuration of the feature of the present invention, while illustration of the same configurations as the prior art are partly omitted.

An external address Add is a signal comprising plural bits which represent an address which designates a memory cell, to which an access is to be made, in the DRAM cell array 11 or the SRAM cell array 12. The external address Add is supplied from an external control circuit (not illustrated) such as a CPU (central processing unit) through an address bus. In this case, the external address Add may be the same type as normally used in the SRAM, namely all bits thereof are concurrently supplied. Notwithstanding, similarly to the normal DRAM, row bits and column bits may be supplied in the form of time-division, wherein an internal configuration of an input unit for receiving the external address Add is adopted, for example, an internal configuration of a pre-decoder 101 may be adopted.

A chip select signal CS is an external signal which designates an operational mode of the semiconductor memory device. In this case, if the chip select signal CS is active, then the normal operation mode is selected. If the chip select signal CS is inactive, then the stand-by mode is selected. The normal operation mode is to allow data read and write operations from and to each memory cell of the DRAM cell array 11 and the SRAM cell array 12.

In the normal operation mode, refresh operations to the DRAM cell array 11 are automatically executed at a predetermined time interval. In the stand-by mode, the refresh operations to the DRAM cell array 11 are discontinued. Accordingly, in the stand-by mode, data in the SRAM cell array 12 are held, while data in the DRAM cell array 11 are not held.

The pre-decoder 101 fetches the external address Add at the predetermined timing and judges whether the external address Add is allocated to the DRAM cell array 11 or the SRAM cell array 12. If the external address Add designates an address of the DRAM cell array 11, then the pre-decoder 101 decodes the external address Add to a row pre-decode signal A1 and a column pre-decode signal A3, and outputs the low and column pre-decode signals A1 and A3, as well as outputs a cell-selecting signal C1 which shows that an access is to be made to the DRAM cell array 11. If the external address Add designates an address of the DRAM cell array 11, then the pre-decoder 101 decodes the external address Add to a row pre-decode signal A2 and the column pre-decode signal A3, and outputs the low and column pre-decode signals. A1 and A3, as well as outputs a cell-selecting signal C1 which shows that an access is to be made to the SRAM cell array 12. The SRAM cell array 12 is previously divided in the row address unit into a data storage region 12a and a redundancy region 12b. The row pre-decode signal A2 outputted from the pre-decoder 101 corresponds to the data storage region 12a.

A redundancy judging circuit 102 is a circuit for judging whether the row address included in the external address Add corresponds to any of zero to plural address values designated by a redundancy program circuit 103. Namely, the redundancy judging circuit 102 is a circuit for judging whether a memory cell (a word line) in the DRAM cell array 11 or the SRAM cell array 12, which corresponds to the external address Add, would be the memory cell (the word line) which is needed to be saved (or replaced) by the redundancy memory cell. The zero to plural address values designated by the redundancy program circuit 103 represent a row address of a memory cell which is not usable as being defective in the DRAM cell array 11 and the SRAM cell array 12. If the redundancy judging circuit 102 confirmed that the row address included in the external address Add corresponds to any of the address values designated by the redundancy program circuit 103, then the redundancy judging circuit 102 outputs a row pre-decode signal A4 which has been obtained by pre-decoding a row address pre-determined for every address designated by the redundancy program circuit 10, wherein the row address is in the redundancy region 12b of the SRAM cell array 12. This row pre-decode signal A4 is a selecting signal which corresponds to a row address, to which a replacement is to be made, or a row address in the redundancy region 12b.

The redundancy judging circuit 102 outputs a killer signal C2 which renders valid or invalid (null) the row pre-decode signals A1 and A2 outputted from the pre-decoder 101. In this embodiment, if the killer signal C2 is high level "H", then the row pre-decode signals A1 and A2 are valid. If the killer signal C2 is low level "L", then the row pre-decode signals A1 and A2 are invalid (null).

Accordingly, if the redundancy judging circuit 102 judged that the row address included in the external address Add corresponds to any of the address values designated by the redundancy program circuit 103, then the redundancy judging circuit 102 outputs the killer signal C2 of low level "L" to render the row pre-decode signals A1 and A2 invalid (null), and also render the cell-selecting signal C1 invalid (null), thereby forcing to select the SRAM cell array 12. Further, the redundancy judging circuit 102 places an output line of the row pre-decode signal A4 into a low impedance state.

If the redundancy judging circuit 102 judged that the row address included in the external address Add does not correspond to any address values designated by the redundancy program circuit 103, then the redundancy judging circuit 102 outputs the killer signal C2 of high level "H" to render the row pre-decode signals A1 and A2 valid, and also render the cell-selecting signal C1 valid, thereby to select either the DRAM cell array 11 or the SRAM cell array 12 in accordance with the cell-selecting signal C1. Further, the redundancy judging circuit 102 places the output line of the row pre-decode signal A4 into a high impedance state.

In this embodiment, a gate circuit 124 is provided to take an AND-operation of the cell-selecting signal C1 and the killer signal C2 to supply the same to a column decoder 109. If the logic level outputted from the gate circuit 124 is "L", then the column decoder 109 forces to select the SRAM cell array 12. If the logic level is "H", then the column decoder 109 forces to select the DRAM cell array 11 or the SRAM cell array 12 in accordance with the cell-selecting signal C1.

The redundancy program circuit 103 generates and outputs a signal which represents a row address which corresponds to a word line, on which a memory cell is present, which is defective in a hold-characteristic or a characteristic or an operation of transistor, in each memory cells in the DRAM cell array 11 or in each memory cells in the data storage region 12a of the SRAM cell array 12. The redundancy program circuit 103 may, for example, be configured by utilizing a non-volatile memory, interconnections which are disconnectable by a laser or an access current or fuse circuits. The address to be programmed is an address of the word line which includes a memory cell which has been judged to be detective based on the result of tests for operations and performances of the memory cells in the manufacturing test.

The row pre-decode signal A1 outputted from the pre-decoder 101 is inputted into the gate circuit 104 which has an input and an output for plural bits. If the killer signal C2 is high level, then the gate circuit 104 allows the row pre-decode signal A1 to pass through. If the killer signal C2 is low level, then the gate circuit 104 outputs a row pre-decode signal of low level "L" which means that all bits are non-selective state independent from the row pre-decode signal A1. The signal with the plural bits outputted from the gate circuit 104 is inputted into one input of a multiplexer 105 having input and output for plural bits.

A refresh address generating circuit 106 repeatedly generates a refresh address AS which corresponds to all row addresses of the DRAM cell array 11, in accordance with a timing signal C3 supplied from a refresh control circuit 107, and supplies the refresh address A5 to another input of the multiplexer 105. A pre-decoder 116 pre-decodes the refresh address A5 and outputs a row pre-decode signal A11. A refresh control circuit 107 is a circuit for controlling a timing of execution of the refresh operation to the DRAM cell array 11. The refresh control circuit 107 controls a timing of generating refresh addresses based on a timing signal C3 so that each memory cell in the DRAM cell array 11 is refreshed at a time interval within a data holding time. The refresh control circuit 107 also controls switching operations of the multiplexer 105 based on a switch signal C4. The refresh control circuit 107 repeatedly generates the timing signal C3 at a predetermined time interval, and also generates the switching signal C4 at a refresh timing, so that the multiplexer 105 selects the row pre-decode signal A11 in the refresh address A5. The multiplexer 105 selects any one of the row pre-decode signal A1 inputted through the gate circuit 104 based on the switching signal C4 and the row pre-decode signal A11 and outputs the same as a row pre-decode signal A6.

A chip select signal CS is inputted into the refresh address generating circuit 106, the refresh control circuit 107 and a power circuit 13. The power circuit 13 is a circuit for generating a boosted voltage, a substrate voltage and a refresh voltage which are used for operating the DRAM cell array 11. Each of the refresh address generating circuit 106, the refresh control circuit 107 and the power circuit 13 is provided with a circuit for allowing operation of the each circuit if the chip select signal CS is active, and for discontinuing the operation if the chip select signal CS is inactive. An example of this circuit is a switch for ON-OFF operation of the power line based on the chip select signal CS.

If a row enable signal outputted from a control circuit not illustrated is active, then the row decoder 108 decodes a row pre-decode. signal A6 to activate a word line designated by a decoded result. If the killer signal C2 is low level "L" at a time when the row pre-decode signal A1 is selected, then all bits of the row pre-decode signal A6 are low level "L", whereby any word lines are not activated.

If the cell-selecting signal C1 designates the DRAM cell array 11, then a column decoder 109 decodes a column pre-decode signal A3 and generates and outputs a column selecting signal A7 for selecting a bit line in the DRAM cell array 11 which is designated by the decoded result. If the cell-selecting signal C1 designates the SRAM cell array 12, then a column decoder 109 decodes the column pre-decode signal A3 and generates and outputs a column selecting signal A8 for selecting a bit line in the SRAM cell array 12 which is designated by the decoded result.

A sense amplifier pre-charge circuit 110 for the DRAM cell array 11 comprises sense amplifiers and column switches adopted to the DRAM cell array 11 and a pre-charge circuit. The column switch connects a sense amplifier and a data bus WRB, wherein the sense amplifier has been designated by the column selecting signal A7 outputted from a column decoder 109. If the sense amplifier enable signal is active, then the sense amplifier senses and amplifies a voltage of a bit line connected to a memory cell connected to a word line selected by a row decoder 108, and supplies the amplified voltage to the data bus WRB, or supplies write data on the data bus WRB through a bit line to a memory cell, wherein the write data are stored in the memory cell. If the pre-charge enable signal is active, then the pre-charge circuit pre-charges a potential of the bit line up to a predetermined voltage, for example, ½ of a power voltage.

A sense amplifier pre-charge circuit 111 for the SRAM cell array 12 comprises sense amplifiers and column switches adopted to the SRAM cell array 12 and a pre-charge circuit. The column switch connects a sense amplifier and the data bus WRB, wherein the sense amplifier has been designated by the column selecting signal A8 outputted from the column decoder 109. If the sense amplifier enable signal is active, then the sense amplifier senses and amplifies a voltage of a bit line connected to a memory cell connected to a word line selected by a row decoder 112, and supplies the amplified voltage to the data bus WRB, or supplies write data on the data bus WRB through a bit line to a memory cell, wherein the write data are stored in the memory cell. If the pre-charge enable signal is active, then the pre-charge circuit pre-charges both potentials of the paired bit lines up to the power voltage. The row decoder 112 decodes either one of the row pre-decode signal A2 supplied through the gate circuit 113 and the row pre-decode signal A4 supplied through the redundancy judging circuit 102, and activates a word line designated by the decode result. The gate circuit 113 has the same configuration as the gate circuit 114.

The semiconductor memory device of FIG. 1 with the above configuration operates as follows.

(1) if the chip select signal CS is low level "L", then operations of a buffer circuit for data input-output are discontinued, whereby input and output of data through the data bus WRB are discontinued. Operations of the refresh address generating circuit 106, the refresh control circuit 107 and the power circuit 13 are discontinued. After a predetermined time has passed, then all data in the DRAM cell array 11 are erased. A power voltage is supplied to the SRAM cell array 12, whereby data in the SRAM cell array 12 are held.

(2a) in case that the chip select signal CS is high level "H", if the external address Add has a value corresponding to a memory cell in the DRAM cell array 11 and if the redundancy judging circuit 102 judged that this memory cell is not needed to be saved or replaced, then the cell selecting signal C1 becomes a level which represents that an access is to be made to the DRAM cell array 11, and the killer signal C2 becomes high level "H", whereby the pre-decoder 101 outputs the row pre-decode signal A1 and the column pre-decode signal A3 based on the external address Add. The column decoder 109 generates the column selecting signal A7 based on the column pre-decode signal A3 and supplies the same to the sense amplifier pre-charge circuit 110, resulting in that write and read operations to a memory cell in the DRAM cell array 11 are executed based on the row pre-decode signal A1 and the column pre-decode signal A3 decoded by the pre-decoder 101.

At a predetermined cycle, the row pre-decode signal A11 is supplied to the row decoder 108, and the sense amplifier pre-charge circuit 110 is controlled by a control signal which is not illustrated, whereby memory cells in the DRAM cell array 11 are refreshed sequentially in the word line unit. The refresh operations to the DRAM cell array 11 are executed similarly under other operational conditions (2b), (3a) and (3b), wherein the chip select signal CS is high level "H".

(2b) in case that the chip select signal CS is high level "H", if the external address Add has a value corresponding to a memory cell in the DRAM cell array 11 and if the redundancy judging circuit 102 judged that this memory cell is needed to be saved or replaced, then the cell selecting signal C1 becomes a level which represents that an access is to be made to the DRAM cell array 11, and the killer signal C2 becomes low level "L", whereby the pre-decoder 101 outputs the row pre-decode signal A1 and the column pre-decode signal A3 based on the external address Add. Since the killer signal C2 is low level "L", a select signal with all bits of low level "L" as the row pre-decode signal A6 is supplied to the row decoder 108, whereby word lines in the DRAM cell array 11 are not activated. Since the killer signal C2 is low level "L", the column decoder 109 generates the column selecting signal A8 based on the column pre-decode signal A3 and supplies the column selecting signal A8 to the sense amplifier pre-charge circuit 111. The row pre-decode signal A4 is supplied to the row decoder 112. Write and read operations to a memory cell connected to a predetermined word line in the SRAM cell array 12 are executed based on the row pre-decode signal A4 and the column pre-decode signal A3 outputted from the redundancy judging circuit 102.

(3a) in case that the chip select signal CS is high level "H", if the external address Add has a value corresponding to a memory cell in the SRAM cell array 12 and if the redundancy judging circuit 102 judged that this memory cell is not needed to be saved or replaced, then the cell selecting signal C1 becomes a level which represents that an access is to be made to the SRAM cell array 12, and the killer signal C2 becomes high level "H", whereby the pre-decoder 101 outputs the row pre-decode signal A2 and the column pre-decode signal A3 based on the external address Add. The column decoder 109 generates the column selecting signal A8 based on the column pre-decode signal A3 and supplies the same to the sense amplifier pre-charge circuit 111, resulting in that write and read operations to a memory cell in the region 12a of the SRAM cell array 12 are executed based on the row pre-decode signal A2 and the column pre-decode signal A3 decoded by the pre-decoder 101.

(3b) in case that the chip select signal CS is high level "H", if the external address Add has a value corresponding to a memory cell in the SRAM cell array 12 and if the redundancy judging circuit 102 judged that this memory cell is needed to be saved or replaced, then the cell selecting signal C1 becomes a level which represents that an access is to be made to the SRAM cell array 12, and the killer signal C2 becomes low level "L", whereby the pre-decoder 101 outputs the row pre-decode signal A2 and the column pre-decode signal A3 based on the external address Add. Since the killer signal C2 is low level "L", the column decoder 109 generates the column selecting signal A8 based on the column pre-decode signal A3 and supplies the column selecting signal A8 to the sense amplifier pre-charge circuit 111. The row pre-decode signal A4 is supplied to the row decoder 112. Write and read operations to a memory cell connected to a predetermined word line in the redundancy region 12b of the SRAM cell array 12 are executed based on the row pre-decode signal A4 and the column pre-decode signal A3 outputted from the redundancy judging circuit 102.

As described above, in accordance with this embodiment, a memory cell to be saved in the DRAM cell array 11 and the SRAM cell array 12 is saved or replaced by a memory cell in the predetermined redundancy region in the SRAM cell array 12. In contrast to this embodiment, if a redundancy memory cell for the DRAM cell array 11 is provided as the other DRAM cell, it is necessary to provide a refresh circuit and a control circuit for the DRAM cell serving as the redundancy memory cell. In accordance with this embodiment, the SRAM cell, which does not need refresh, serves as a redundancy cell for the DRAM cell array 11, thereby allowing reductions in circuit configuration and circuit scale. Further, in accordance with the present invention, redundancy memory cells for the SRAM cells and other redundancy memory cells for the DRAM cells are provided in the same region and commonly use a circuit for access thereto. This allows a further simplification of the circuit.

Second Embodiment

Figure 2:
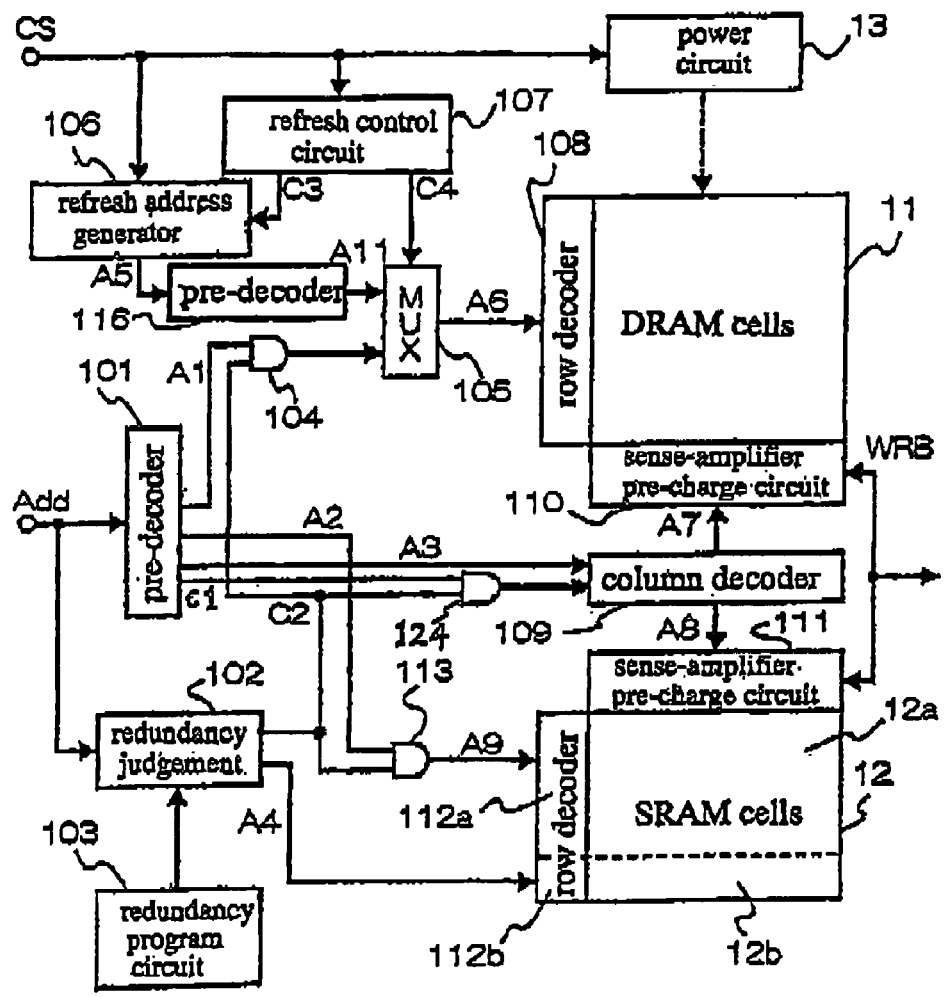
FIG. 2 is a block diagram illustrative of a configuration of a semiconductor memory device of a second embodiment in accordance with the present invention.

A second embodiment will hereinafter be described with reference to FIG. 2. The semiconductor memory device shown in FIG. 2 has two row decoders 112a and 112b instead of the row decoder 112. In the configuration shown in FIG. 2, the same constitutional elements as in FIG. 1 are provided with the same reference numbers or codes. The row-decoder 112a decodes a row pre-decode signal A9 of the gate circuit 113 to activate any word line in the region 12a of the SRAM cell array 12. The row-decoder 112b decodes a row pre-decode signal A4 outputted from the redundancy judging circuit 102 to activate any word line in the region 12b of the SRAM cell array 12.

In accordance with this embodiment, in addition: to the effects obtained in the first embodiment, the following effects are obtained. dedicated decoders respectively for the regions 12a and 12b in the SRAM cell array 12, so that the bit number of the row pre-decode signal A4 may be limited to the corresponding number to the word line number in the region 12b.

Third Embodiment

Figure 3:
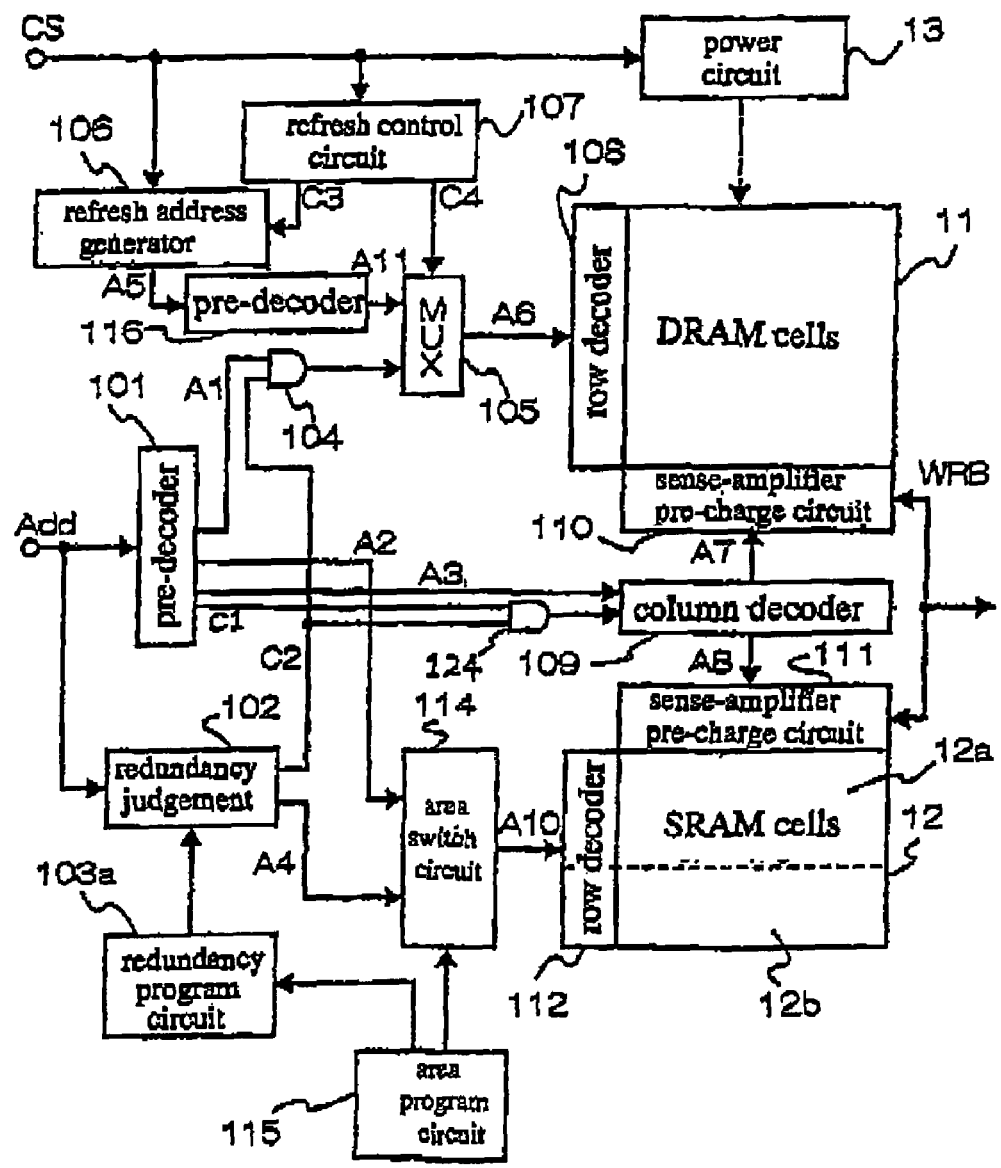
FIG. 3 is a block diagram illustrative of a configuration of a semiconductor memory device of a third embodiment in accordance with the present invention.

A third embodiment will hereinafter be described with reference to FIG. 3. The semiconductor memory device shown in FIG. 3 has an area switching circuit 114 and an area program circuit 115, and further a configuration in a redundancy program circuit 103a for processing signals from the area program circuit 115, in addition to the configuration of FIG. 1. In the configuration shown in FIG. 3, the same constitutional elements as in FIG. 1 are provided with the same reference numbers or codes.

The area switching circuit 114 and the area program circuit 115 are provided in order to allow optionally setting or allocating a data storage area 12a and a redundancy area 12b in the SRAM cell array 112. For example, it is possible that the entirety of the SRAM cell array 112 may be configured to be divided into a plurality of divided areas based on word lines, for example, 16 divided areas, wherein fourteen divided areas constitute the data storage area 12a and the remaining two divided areas constitute the redundancy area 12b. The area program circuit 115 outputs data, based on which the redundancy area 12b (or the data storage area 12a) is defined. The area switching circuit 114 converts the row pre-decode signal A2 into a row pre-decode signal A10 which corresponds to the data storage area 12a and also converts the row pre-decode signal A4 into a row pre-decode signal A10 which corresponds to the redundancy area 12b.

The area program circuit 115 comprises a fuse circuit which includes programmable interconnections and active elements by a laser irradiation or an excess current application in the fabrication process. The area program circuit 115 outputs data which represent the number of the divided areas in accordance with the program statement, (for example, the number is an optional from 0~16). The area switching circuit 114 may also comprise a plurality of multiplexer circuits, and gate circuits for rendering invalid (null) the row pre-decode signal A2 upon supply of the row pre-decode signal A4. The redundancy program circuit 103a decides an address, at which a replacement is to be made, based on signals from the area program circuit 115, wherein the signals represent states of the redundancy area 12b and he data storage area 12a.

In accordance with this embodiment, in addition to the effects obtained in the first embodiment, the following effects are obtained. Since, for example, the placement and capacity of the redundancy area 12b may optionally be set for each memory chip, then the redundancy area 12b may be set in an area free of any defective cell, and it is also possible to optionally change the ratio of the area 12a to the area 12b.

The embodiments of the semiconductor memory device in accordance with the present invention have been described with reference to FIGS. 1–3. Notwithstanding, the embodiments are not intended to limit the present invention. Design changes are available for integrating circuit blocks and dividing each circuit functions and adding conventional other configurations. In the above embodiment, the external access is made similarly to the SRAM, wherein the normal address Add is non-synchronously supplied in parallel to all bits. Notwithstanding, it is possible that similarly to the normal DRAM, the column address and the row address are supplied in time-division, or similarly to the SRAM (synchronous DRAM), the normal address is supplied in synchronizing with a clock signal. In the embodiments, the refresh control circuit for DRAM is provided in the semiconductor memory device. The refresh control circuit may be provided outside the semiconductor memory device. In the embodiment, the redundancy memory cell is provided for the word line unit. The redundancy memory cell may be provided for the bit line unit or the plural word line unit. It is not essential that all of the respective constitutional elements of the semiconductor memory device are provided in a single memory chip. It is possible to use a plurality of memory chips to form a memory module.

Further, in the first to third embodiments, the DRAM cell array is the example of the memory cell array which needs refresh, while the SRAM cell array is the example of the memory cell array which does not need refresh. The present invention is not intended to limit this example. The present invention is applicable to other examples that the memory cell array, which does not need refresh, may comprise non-volatile memory cell array such as a Flash cell array, an FeRAM cell array, an MRAM cell array, and an EEPROM cell array.

Further, an entirety of the circuit of the semiconductor memory device comprising the memory cell arrays and peripheral circuits may be mounted on a single chip or may be divided into plural function blocks which are mounted on plural chips respectively and separately. In the later case, it is possible that the memory cell array and the peripheral circuit are provided on chips separately to form a hybrid IC. It is also possible that in the peripheral circuit, only redundancy circuits such as the redundancy program circuit 103, the area switching circuit 114 and the area program circuit are provided on the other chip than the memory chip to form another hybrid IC.

Whereas the embodiments of the present invention have been described above, the present invention is not intended to limit those embodiments. Design changes without deviation from the subject matters of the present invention are included in the present invention.

INDUSTRIAL APPLICABILITY

In accordance with this invention, the following effects are obtained. There are provided a dynamic memory cell array further comprising an array of a plurality of dynamic memory cells; a static memory cell array further comprising an array of a plurality of static memory cells; a first conversion means for converting an external address into an address which corresponds to any memory cell in said dynamic memory cell array or said static memory cell array; a memory cell specifying means for specifying at least a memory cell in said dynamic memory cell array, said at least memory cell being to be replaced; and a second conversion means for converting an external address, which corresponds to said at least memory cell specified by said memory cell specifying means, into an address, which corresponds to a predetermined memory cell in said static memory cell array. The redundancy memory cells comprise SRAM cells, and any refresh circuit for refreshing the redundancy memory cells is unnecessary, thereby reducing the scales of the redundancy memory and the peripheral circuit in the semiconductor memory device, wherein the external addresses are allocated to both the DRAM and the SRAM.

What is claimed is:

1. A semiconductor memory device, comprising:
   a dynamic memory cell array further comprising an array of a plurality of dynamic memory cells;
   a static memory cell array further comprising an array of a plurality of static memory cells;
   a first conversion means for converting an external address into an address which corresponds to any memory cell in said dynamic memory cell array or said static memory cell array;
   a memory cell specifying means for specifying at least one memory cell in said dynamic memory cell array, said at least one memory cell being to be replaced; and
   a second conversion means for converting an external address, which corresponds to said at least one memory cell specified by said memory cell specifying means, into an address, which corresponds to a predetermined memory cell in said static memory cell array, wherein said memory cell specifying means specifies a memory cell which is to be replaced in said dynamic memory cell array and also specifies another memory cell which is to be replaced in said static memory cell array.

2. The semiconductor memory device as claimed in claim 1, further comprising:
   a refresh control means for controlling refresh operations to said dynamic memory cell array; and
   a control means for at least discontinuing operations said refresh control means based on an external control signal.

3. The semiconductor memory device as claimed in claim 1, further comprising:
   a refresh address generating circuit for repeatedly generating a refresh address which corresponds to each memory cell of said dynamic memory cell array, based on a predetermined timing signal; and a selecting circuit for selecting any one of said external address and said refresh address.

4. The semiconductor memory device as claimed in claim 1, wherein a supply of a power to said dynamic memory cell array is discontinued by an external control signal.

5. The semiconductor memory device as claimed in claim 1,
wherein when said second conversion means converts said external address, which corresponds to said memory cell specified by said memory cell specifying means, into said address, which corresponds to the predetermined memory cell in said static memory cell array, said second conversion means converts said external address into said address within said address range specified by said memory cell specifying means, and also said second conversion means converts an external address, which corresponds to a memory cell other than said memory cells specified by said memory cell specifying means, into an address outside an address range set by an address range setting means.

6. A semiconductor memory device comprising:
a first memory cell array having a plurality of memory cells which need refresh;
a second memory cell array having a plurality of memory cells which do not need refresh; and
a first conversion circuit for comparing a replaced address, which designates a memory cell to be replaced in said first and second memory cell arrays, with an external input address,
wherein if said replaced address does not correspond to said external address, then said first conversion circuit allows an access to a memory cell designated by said external address, and
wherein if said replaced address corresponds to said external address, then said first conversion circuit converts said external address into a replace-destination address, with which said replaced address is to be replaced, said replace-destination address designates a memory cell in a predetermined area in said second memory cell array, and said first conversion circuit allows an access to said replace-destination address.

7. The semiconductor memory device as claimed in claim 6, further including: a replaced address memory circuit for storing said replaced address.

8. The semiconductor memory device as claimed in claim 7, wherein said replaced address memory circuit comprises a program circuit.

9. The semiconductor memory device as claimed in claim 6, wherein if said replaced address does not correspond to said external address, then said first address conversion circuit generates a signal which invalidates a first address signal designating a memory cell in said first memory cell array, a second address signal designating a memory cell in said second memory cell array, and a selecting signal selecting any one of said first and second memory cell arrays.

10. The semiconductor memory device as claimed in claim 6, further including:
a replace-destination address range setting circuit for setting a replace-destination address range in said second memory cell array, wherein if said replaced address does not correspond to said external address, then said first address conversion circuit converts said external address into an address outside said replace-destination address range as set, and if said replaced address corresponds to said external address, then said first address conversion circuit converts said external address into an address in said replace-destination address range as set.

11. The semiconductor memory device as claimed in claim 6, wherein said first memory cell array has a dedicated decode circuit for decoding an address in said predetermined area, and said first address conversion circuit supplies said replace-destination address directly to said decode circuit.

12. An address conversion circuit for converting an address which designates a memory cell in a semiconductor memory device which has a first memory cell array having a plurality of memory cells which need refresh, and a second memory cell array having a plurality of memory cells which do not need refresh,
wherein said address conversion circuit compares a replaced address, which designates a memory cell to be replaced in said first and second memory cell arrays, with an external input address,
wherein if said replaced address does not correspond to said external address, then said address conversion circuit allows an access to a memory cell designated by said external address, and
wherein if said replaced address corresponds to said external address, then said address conversion circuit converts said external address into a replace-destination address, with which said replaced address is to be replaced, said replace-destination address designates a memory cell in a predetermined area in said second memory cell array, and said first conversion circuit allows an access to said replace-destination address.

13. The address conversion circuit as claimed in claim 12, further including: a replaced address memory circuit for storing said replaced address.

14. The address conversion circuit as claimed in claim 13, wherein said replaced address memory circuit comprises a program circuit.

15. The address conversion circuit as claimed in claim 12, wherein if said replaced address does not correspond to said external address, then said address conversion circuit generates a signal which invalidates a first address signal designating a memory cell in said first memory cell array, a second address signal designating a memory cell in said second memory cell array, and a selecting signal selecting any one of said first and second memory cell arrays.

16. The address conversion circuit as claimed in claim 12, wherein said first memory cell array has a dedicated decode circuit for decoding an address in said predetermined area, and said address conversion circuit supplies said replace-destination address directly to said decode circuit.

* * * * *